(12) United States Patent
Dunn et al.

(10) Patent No.: US 11,042,183 B2
(45) Date of Patent: Jun. 22, 2021

(54) ELECTRONIC DISPLAY WITH MOUNT-ACCESSIBLE COMPONENTS

(71) Applicant: Manufacturing Resources International, Inc., Alpharetta, GA (US)

(72) Inventors: William Dunn, Alpharetta, GA (US); David Williams, Canton, GA (US); Ware Bedell, Cumming, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 300 days.

(21) Appl. No.: 16/253,091

(22) Filed: Jan. 21, 2019

(65) Prior Publication Data

US 2019/0155331 A1   May 23, 2019

Related U.S. Application Data

(63) Continuation of application No. 15/589,552, filed on May 8, 2017, now Pat. No. 10,185,353, which is a
(Continued)

(51) Int. Cl.
*H05K 5/00* (2006.01)
*G06F 1/16* (2006.01)
(Continued)

(52) U.S. Cl.
CPC ............ *G06F 1/1601* (2013.01); *G06F 1/181* (2013.01); *H01R 12/7076* (2013.01); *H01R 12/73* (2013.01); *H04N 5/63* (2013.01); *H04N 5/64* (2013.01); *H04N 5/655* (2013.01); *H05K 1/117* (2013.01); *G06F 2200/1612* (2013.01); *H01L 23/3107* (2013.01); *H01L 23/32* (2013.01);
(Continued)

(58) Field of Classification Search
CPC .................................................. G06F 1/1601
USPC ...................................... 361/679.23, 679.06
See application file for complete search history.

(56) References Cited

U.S. PATENT DOCUMENTS

| 5,621,890 A * | 4/1997 | Notarianni ............ G06F 1/1632 361/724 |
| 5,631,805 A | 5/1997 | Bonsall |

(Continued)

FOREIGN PATENT DOCUMENTS

| EP | 2382775 A1 | 11/2011 |
| JP | 2000122575 A | 4/2000 |

(Continued)

*Primary Examiner* — Binh B Tran
(74) *Attorney, Agent, or Firm* — Standley Law Group LLP; Jeffrey S. Standley; Eric M. Gayan

(57) ABSTRACT

An electronic display where various electrical components may be removed from a housing of the display and serviced or replaced without having to demount the display. The electronic display may include an electronic image-producing assembly in electrical communication with a backplane. Various electrical components (e.g., electronic assemblies) may be removably connected to the backplane using self-guiding electrical connectors. An access opening through a wall of the housing may be provided to facilitate removal of an electrical assembly through the housing while the display remains mounted to a vertical surface.

17 Claims, 4 Drawing Sheets

Related U.S. Application Data continuation of application No. 12/684,608, filed on Jan. 8, 2010, now Pat. No. 9,648,270.

(60) Provisional application No. 61/143,189, filed on Jan. 8, 2009.

(51) Int. Cl.

| | | |
|---|---|---|
| *G06F 1/18* | (2006.01) | |
| *H04N 5/63* | (2006.01) | |
| *H04N 5/64* | (2006.01) | |
| *H01R 12/70* | (2011.01) | |
| *H01R 12/73* | (2011.01) | |
| *H04N 5/655* | (2006.01) | |
| *H05K 1/11* | (2006.01) | |
| H01L 23/31 | (2006.01) | |
| H01L 23/32 | (2006.01) | |
| H01R 12/00 | (2006.01) | |

(52) U.S. Cl.
CPC ........ *H01R 12/00* (2013.01); *H05K 2201/044* (2013.01); *H05K 2201/0999* (2013.01); *H05K 2201/09754* (2013.01); *H05K 2201/1034* (2013.01)

(56) References Cited

U.S. PATENT DOCUMENTS

| | | |
|---|---|---|
| 5,636,101 A | 6/1997 | Bonsall et al. |
| 5,640,302 A * | 6/1997 | Kikinis ............... G06F 1/1616 361/679.26 |
| 5,729,289 A | 3/1998 | Etoh |
| 5,786,801 A | 7/1998 | Ichise |
| 5,809,432 A | 9/1998 | Yamashita |
| 5,952,992 A | 9/1999 | Helms |
| 6,144,359 A | 11/2000 | Grave |
| 6,292,157 B1 | 9/2001 | Greene et al. |
| 6,330,150 B1 | 12/2001 | Kim |
| 6,639,790 B2 | 10/2003 | Tsai et al. |
| 6,812,851 B1 | 11/2004 | Dukach et al. |
| 6,850,209 B2 | 2/2005 | Mankins et al. |
| 6,937,258 B2 | 8/2005 | Lim et al. |
| 6,962,528 B2 | 11/2005 | Yokota |
| 7,064,672 B2 | 6/2006 | Gothard |
| 7,092,248 B2 | 8/2006 | Shu |
| 7,230,659 B2 | 6/2007 | Ha et al. |
| 7,334,361 B2 | 2/2008 | Schrimpf et al. |
| 7,339,782 B1 | 3/2008 | Landes et al. |
| 7,513,830 B2 | 4/2009 | Hajder et al. |
| 7,518,600 B2 | 4/2009 | Lee |
| 7,589,958 B2 | 9/2009 | Smith |
| 7,609,506 B2 | 10/2009 | Aguirre |
| 7,774,633 B1 | 8/2010 | Harrenstien et al. |
| 8,102,173 B2 | 1/2012 | Merrow |
| 8,116,081 B2 | 2/2012 | Crick, Jr. |
| 8,144,110 B2 | 3/2012 | Huang |
| 8,310,824 B2 | 11/2012 | Dunn et al. |
| 8,352,758 B2 | 1/2013 | Atkins |
| 9,072,166 B2 | 6/2015 | Dunn et al. |
| 9,286,020 B2 | 3/2016 | Dunn et al. |
| 9,313,447 B2 | 4/2016 | Dunn et al. |
| 9,451,060 B1 | 9/2016 | Bowers et al. |
| 9,516,485 B1 | 12/2016 | Bowers et al. |
| 9,578,273 B2 | 2/2017 | Dunn et al. |
| 9,622,392 B1 | 4/2017 | Bowers et al. |
| 9,648,270 B2 | 5/2017 | Williams et al. |
| 9,974,142 B2 | 5/2018 | Dunn et al. |
| 10,185,352 B2 | 1/2019 | Dunn et al. |
| 10,185,353 B2 | 1/2019 | Dunn et al. |
| 2001/0043290 A1 | 11/2001 | Yamamoto |
| 2002/0112026 A1 | 8/2002 | Fridman et al. |
| 2002/0140651 A1 | 10/2002 | Lim et al. |
| 2002/0164962 A1 | 11/2002 | Mankins et al. |
| 2002/0186333 A1 | 12/2002 | Ha et al. |
| 2003/0039094 A1 | 2/2003 | Sarkinen et al. |
| 2003/0204342 A1 | 10/2003 | Law et al. |
| 2004/0036697 A1 | 2/2004 | Kim et al. |
| 2004/0257492 A1 | 12/2004 | Mai et al. |
| 2005/0007500 A1 | 1/2005 | Lin et al. |
| 2005/0073518 A1 | 4/2005 | Bontempi |
| 2005/0162822 A1 | 7/2005 | Shu |
| 2005/0202879 A1 | 9/2005 | Hussaini et al. |
| 2005/0231457 A1 | 10/2005 | Yamamoto et al. |
| 2006/0103299 A1 | 5/2006 | Kwok et al. |
| 2006/0215421 A1 | 9/2006 | Chang et al. |
| 2006/0218828 A1 | 10/2006 | Schrimpf et al. |
| 2006/0238531 A1 | 10/2006 | Wang |
| 2006/0292931 A1 | 12/2006 | Tokuda |
| 2007/0267554 A1 | 11/2007 | Tannas, Jr. |
| 2008/0002350 A1 | 1/2008 | Farrugia |
| 2008/0018584 A1 | 1/2008 | Park et al. |
| 2008/0024268 A1 | 1/2008 | Wong et al. |
| 2008/0055297 A1 | 3/2008 | Park |
| 2008/0084166 A1 | 4/2008 | Tsai |
| 2008/0143187 A1 | 6/2008 | Hoekstra et al. |
| 2008/0304219 A1 | 12/2008 | Chen |
| 2009/0009997 A1 | 1/2009 | Sanfilippo et al. |
| 2009/0102744 A1 | 4/2009 | Ram |
| 2009/0104989 A1 | 4/2009 | Williams et al. |
| 2009/0310066 A1 | 12/2009 | Schuch et al. |
| 2010/0007596 A1 | 1/2010 | Cho et al. |
| 2010/0164836 A1 | 7/2010 | Liberatore |
| 2010/0195351 A1* | 8/2010 | Ueyama ............... G02B 6/0088 362/613 |
| 2011/0013367 A1 | 1/2011 | Williams et al. |
| 2011/0019348 A1 | 1/2011 | Kludt et al. |
| 2011/0116231 A1 | 5/2011 | Dunn et al. |
| 2011/0134356 A1 | 6/2011 | Swatt et al. |
| 2011/0227467 A1 | 9/2011 | Foppe, Jr. et al. |
| 2011/0231676 A1 | 9/2011 | Atkins |
| 2011/0260534 A1 | 10/2011 | Rozman et al. |
| 2011/0302440 A1 | 12/2011 | DiMarco et al. |
| 2013/0027370 A1 | 1/2013 | Dunn et al. |
| 2013/0270975 A1 | 10/2013 | Dunn et al. |
| 2014/0109387 A1 | 4/2014 | Dunn |
| 2016/0014103 A1 | 1/2016 | Masters et al. |
| 2016/0198545 A1 | 7/2016 | Dunn et al. |
| 2017/0111521 A1 | 4/2017 | Bowers et al. |
| 2017/0140344 A1 | 5/2017 | Bowers et al. |
| 2017/0147992 A1 | 5/2017 | Bowers et al. |
| 2017/0163928 A1 | 6/2017 | Dunn et al. |
| 2017/0242454 A1 | 8/2017 | Dunn et al. |

FOREIGN PATENT DOCUMENTS

| | | |
|---|---|---|
| JP | 2006145890 A | 6/2006 |
| JP | 2007087662 A | 4/2007 |
| JP | 2008046435 A | 2/2008 |
| KR | 20000021499 A | 4/2000 |
| KR | 20020072633 A | 9/2002 |
| KR | 20030088786 A | 11/2003 |
| KR | 20050023882 A | 3/2005 |
| KR | 1020060030424 | 4/2006 |
| KR | 20070070711 A | 7/2007 |
| KR | 20080000144 A | 1/2008 |
| KR | 20080029114 A | 4/2008 |
| KR | 1020080046335 A | 5/2008 |
| WO | WO2008050402 | 5/2008 |
| WO | WO2009152310 A3 | 12/2009 |
| WO | WO2010059930 A3 | 5/2010 |
| WO | WO2010081011 A1 | 7/2010 |
| WO | WO2011112848 A2 | 9/2011 |

* cited by examiner

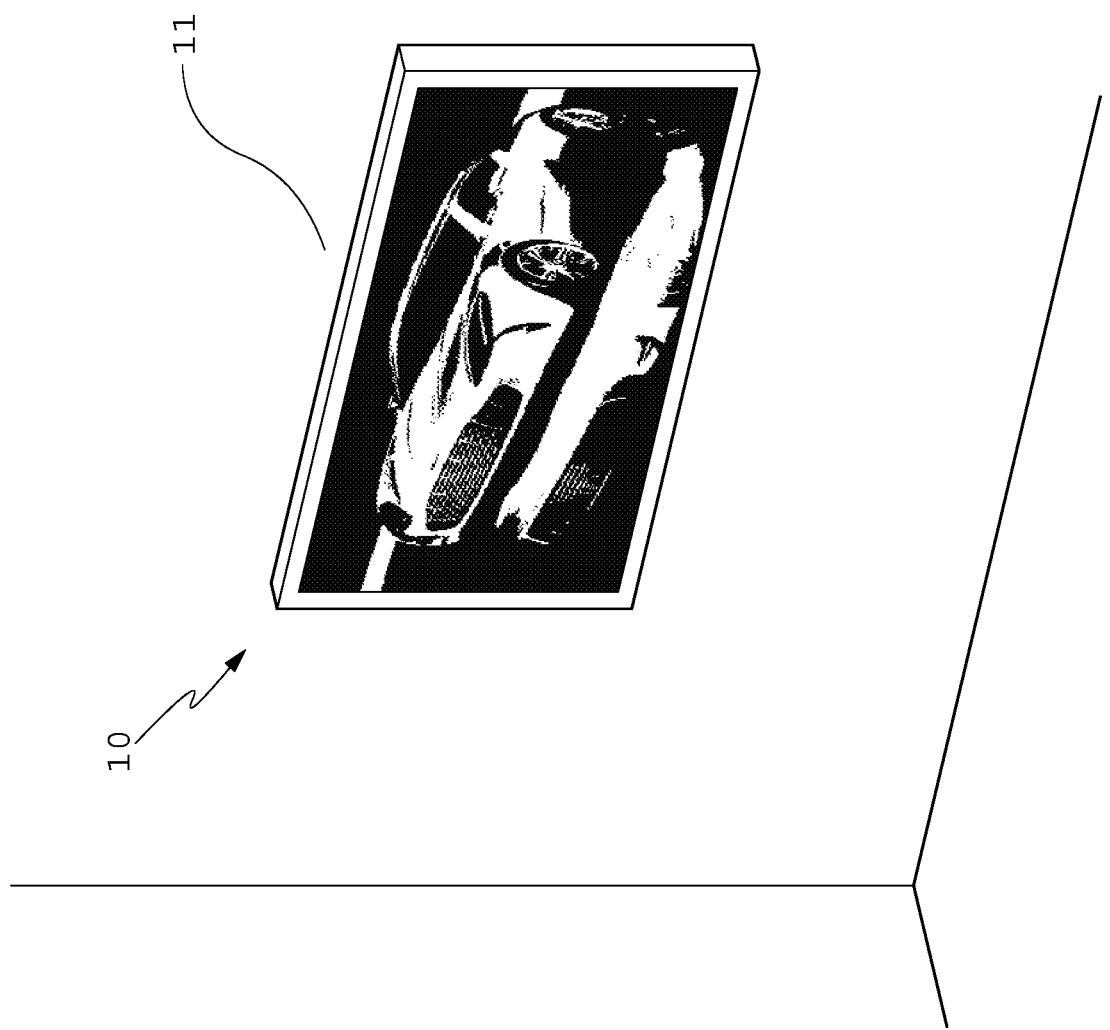

ELECTRONIC DISPLAY WITH MOUNT-ACCESSIBLE COMPONENTS

CROSS-REFERENCE TO RELATED APPLICATIONS

This application is a continuation of U.S. application Ser. No. 15/589,552 filed on May 8, 2017, which is a continuation of U.S. application Ser. No. 12/684,608 filed on Jan. 8, 2010 and issued on May 9, 2017 as U.S. Pat. No. 9,648,270, which claims the benefit of U.S. Provisional Application No. 61/143,189 filed on Jan. 8, 2009, all of which are hereby incorporated by reference in their entirety as if fully cited herein.

TECHNICAL FIELD

Exemplary embodiments relate generally to an electronic display with components that may be removed and replaced without removing the electronic display from a mounted position.

BACKGROUND AND SUMMARY OF THE EXEMPLARY EMBODIMENTS

Electronic displays have become useful for not only indoor entertainment purposes, but also for indoor and outdoor advertising/informational purposes. For example, liquid crystal displays (LCDs), plasma displays, and many other flat panel displays are now being used to display information and advertising materials to consumers in locations outside of their own home, such as within airports, arenas, stadiums, restaurants/bars, gas station pumps, billboards, and even moving displays on the tops of automobiles or on the sides of trucks.

The rapid development of flat panel displays has allowed for mounting in a variety of locations that were not previously available. Further, the popularity of high definition (HD) television has increased the demand for larger and brighter displays, especially large displays which are capable of producing HD video. The highly competitive field of consumer advertising has also increased the demand for large, attention-grabbing, bright displays. Displays that can provide these features typically contain a number of advanced electronic assemblies, which over time, can fail or degrade in performance. Once these displays are mounted in a desired position, replacing any failed electronic assemblies can be a costly and time-consuming process. Further, electronic assembly replacement typically requires a 'clean room' environment or further special equipment. Still further, special knowledge and training on the specific technologies involved is often required to trouble-shoot and service these advanced displays.

Exemplary electronic display embodiments include electronic assemblies that may be removed, serviced, and/or replaced without removing the display from its mounted position. The electronic assemblies can be removed through an opening in a housing of the electronic display, and may electrically connect to associated components of the display using self-aligning connectors such as blind mate connectors. N+1 power supplies may be utilized to increase the reliability of an exemplary electronic display (where N is the number of power supplies required to run the display).

Exemplary electronic display embodiments facilitate quick servicing by minimally-trained personnel while the display remains in its mounted position. An end user may even service an exemplary electronic display themselves. Further, a plurality of different electronic display configurations can be sold, all of which are based on the same display platform. Thus, end users may select the precise components they desire or may upgrade original components based on alternative or improved technologies. This may reduce manufacturing costs as display manufacturers can produce only a few base models that may be later adapted to the precise requirements of the end user.

BRIEF DESCRIPTION OF THE DRAWINGS

A better understanding will be obtained from a reading of the following detailed description and the accompanying drawings wherein identical reference characters refer to identical parts and in which:

FIG. 1A is a perspective illustration of an exemplary electronic display embodiment in a mounted position;

DETAILED DESCRIPTION OF EXEMPLARY EMBODIMENTS

FIG. 1A shows an exemplary electronic display 10 mounted on a vertical surface 11. When electronic components fail in traditional electronic displays, the entire electronic display typically must be removed from its mounted positioned, disassembled, and then serviced. Servicing a traditional electronic display may require a host of special equipment and training, and often further requires a near 'clean room' environment. Exemplary electronic display embodiments shown and described herein are designed to reduce the time and complexity involved in servicing displays and, notably, allows said displays to remain mounted while being serviced.

Figure 1B:
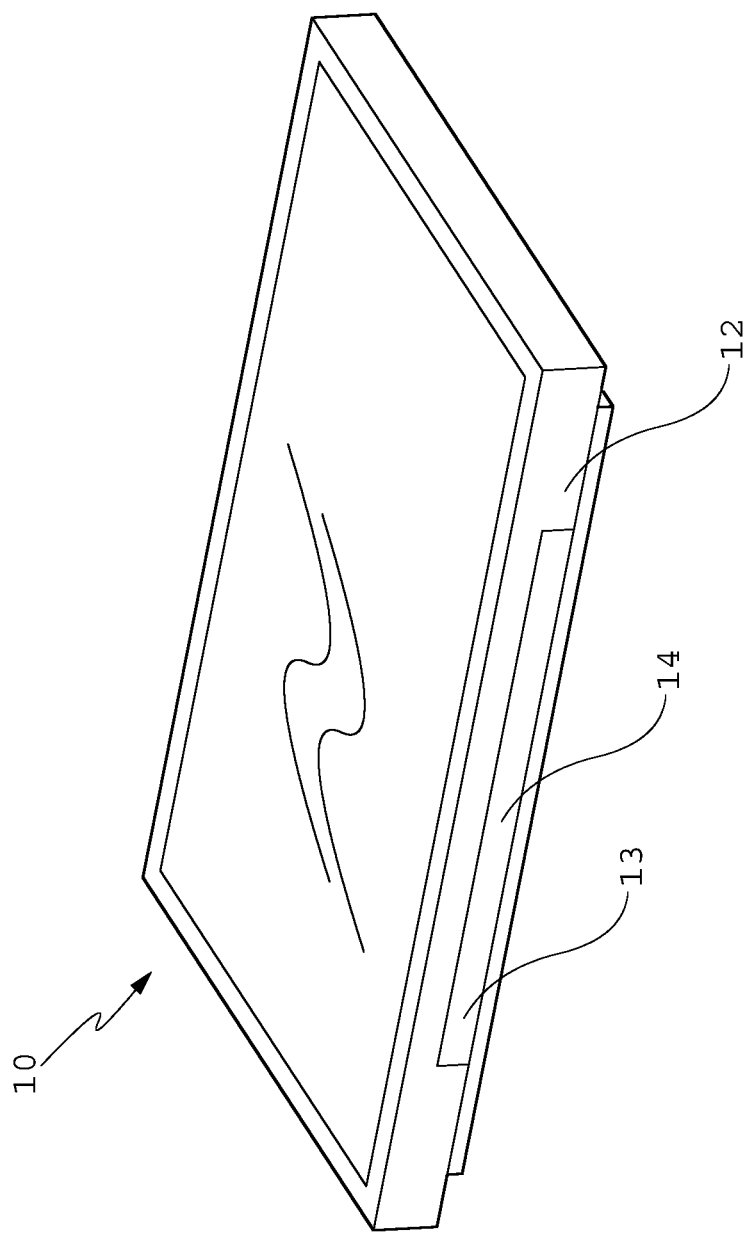
FIG. 1B is a perspective view of the exemplary embodiment of FIG. 1A showing the underside of a housing of the electronic display.

FIG. 1B shows a bottom surface 12 of electronic display 10. An access panel 13 is used in this exemplary embodiment to cover an opening to a compartment within which reside a number of removable electronic assemblies (see FIG. 1C). The access panel 13 may be secured using a lock mechanism 14, which may prevent unauthorized persons from gaining access to the removable electronic assemblies.

Figure 1C:
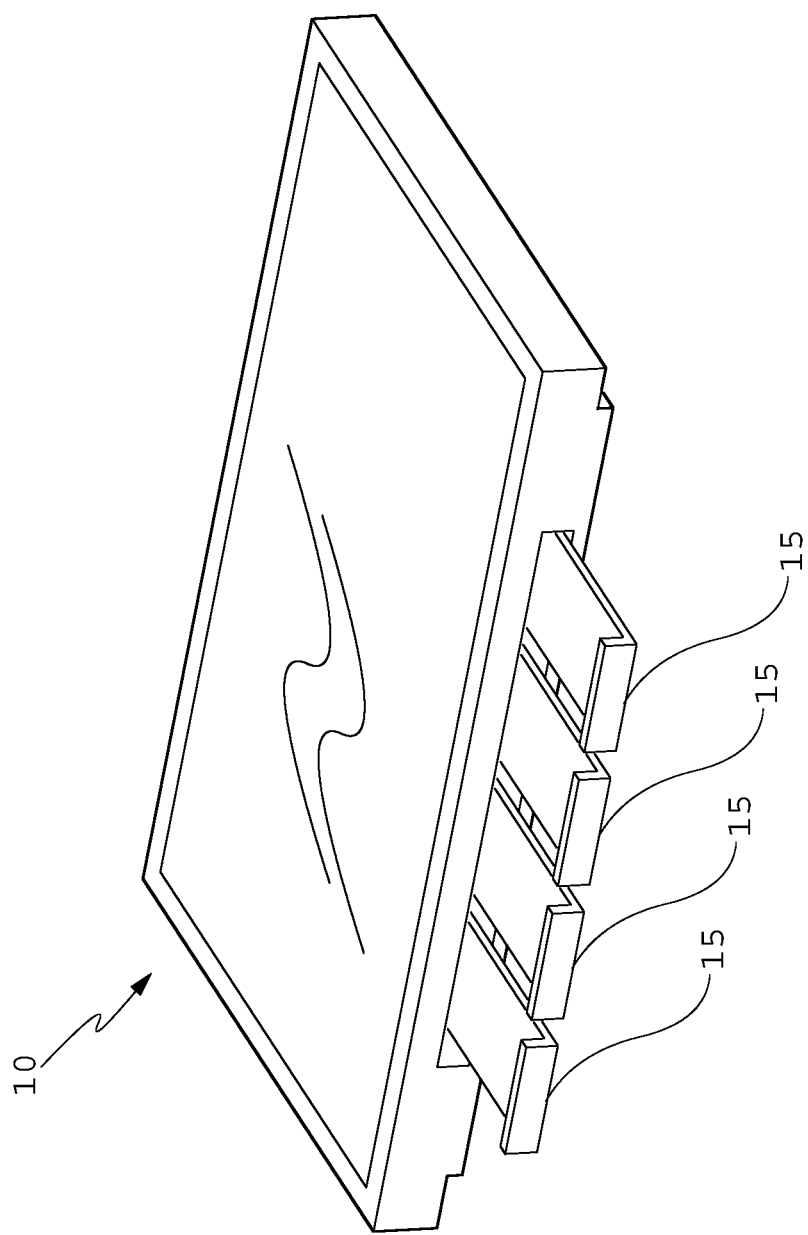
FIG. 1C is a perspective view of the exemplary embodiment from FIG. 1B with an access cover removed from the housing and removable electronic assemblies being accessed through an opening in the housing.

FIG. 1C shows the exemplary electronic display 10 of FIGS. 1A and 1B with the access panel 13 removed and a plurality of electronic assemblies 15 being extracted through the opening. The removable electronic assemblies 15 may be any number of electronic assemblies that are known to occasionally fail. These electronic assemblies may include, but are not limited to, any one of the following: power supplies, analog/digital (A/D) converters, or timing control units (T-cons).

Figure 2:
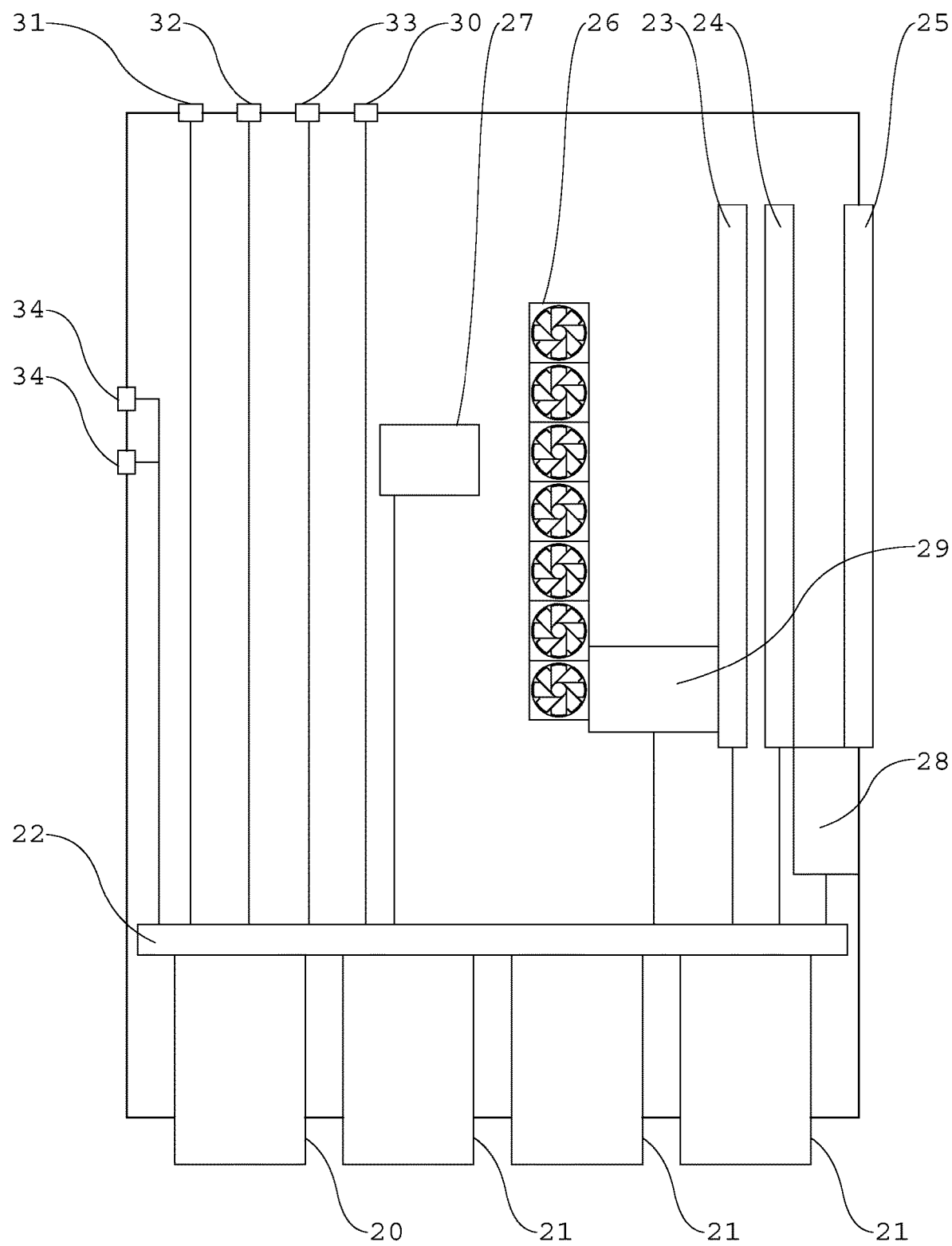
FIG. 2 is a schematic diagram showing various electrical connections for one exemplary electronic display embodiment.

FIG. 2 is a schematic wiring diagram for one exemplary embodiment of an electronic display. In this embodiment, a Tcon has been integrated with an A/D converter into a single display controller assembly 20. This integration allows the complete removal of a low-voltage differential signaling (LVDS) cable. LVDS cables are typically used in traditional displays, and are also known to fail after extended operation. As represented in FIG. 2, this exemplary electronic display embodiment also includes three separate removable power supplies (or power modules) 21. In a preferred embodiment, the removable power supplies 21 are capable of being hot swapped while the electronic display is in operation. For large displays, the removable power supplies 21 may supply, for example, 500 Watts at 24 VDC.

Using the N+1 technique, only two power supplies may be necessary to run the display shown. Thus, during normal operation only two of the three power supplies 21 will be utilized. However, upon failure of one of the power supplies, the remaining two are adequate to run the display until the failed power supply can be replaced. Communication between a backplane 22 and the display controller assembly 20 may instruct an exterior LED to illuminate in order to indicate to a user the need to service the display, and more particularly, that one of the power supplies needs to be replaced. The N+1 technique is extremely useful for displays which provide critical functions and require near constant operation with little or no downtime. It should be noted that the N+1 technique is merely optional, and is not required by any of the various exemplary embodiments. Each of the removable electronic assemblies 20 and 21 may connect with the display backplane 22 using self-aligning connectors such as blind-mate connectors.

FIG. 2 also indicates that the exemplary electronic display embodiment includes a backlight 23, a LCD assembly 24, and a display panel 25. The backlight 23 may be a CCFL or light emitting diode (LED) backlight. It should be noted that although the setup for an LCD is shown, embodiments can be practiced with any electronic image-producing assembly. Thus any other flat panel display could be used such as plasma, light-emitting polymer, and organic light emitting diode (OLED) displays. A fan assembly 26 is also shown for optionally cooling displays that may reach elevated temperatures. One or more temperature sensors 27 may be used to monitor the temperature of the display, and selectively engage the fan assembly 26. An ambient light sensor may be used to tailor the output of the backlight 23 to provide proper illumination based on the surrounding environment.

A variety of different electrical inputs/outputs are also shown in FIG. 2. For example, an AC power input 30 delivers incoming AC power to the backplane 22. A video signal input 31 is provided and is designed to receive video signals from a plurality of different sources. In a preferred embodiment, the video signal input 31 is a HDMI input. Two data interface connections 32 and 33 are also shown. The first data interface connection 32 may be a RS2332 port or an IEEE 802.3 jack, which may facilitate user setup and system monitoring. Either form of the connection should allow electrical communication with a personal computer. The second data interface connection 33 may be a network connection such as an Ethernet port or a wireless connection. The second data interface connection 33 may be utilized to transmit display settings, error messages, and various other forms of data to a website for access and control by the user. Optional audio connections 34 may also be provided for connection to internal or external speaker assemblies.

It should be noted that the wiring diagram shown in FIG. 2 does not require the particular placement and/or wiring of each component as shown therein. Furthermore, the various sensors, electrical connections, and other components are not drawn to scale, nor are they required to be placed in the positions shown.

It should also be noted that integration of the Tcon and A/D converter and elimination of the LVDS cable of a traditional display is not required by the various exemplary electronic display embodiments. Rather, in some exemplary electronic display embodiments a Tcon, A/D converter and LVDS cable may still be provided as separate components, and as either fixed or removable assemblies. The exemplary embodiment shown in FIG. 2 is provided only to illustrate a simplistic manner for creating a durable display. Other combinations of removable assemblies and fixed assemblies are particularly contemplated and would be within the scope of the inventive electronic display embodiments.

Information for monitoring the status of the various display components of an electronic display may be transmitted through either of the two data interface connections 32 and 33, to provide a notification to a user when a component may be functioning improperly, is about to fail, or has already failed, and requires replacement. Alternatively, or in combination, external indicators on the display may also notify a user that display components may need attention. Exterior LEDs, watermarks in the display picture, or other attention-grabbing devices may be used to alert a user to errors within the display. The information for monitoring the status of the display may include, but is not limited to: power supply status, power supply test results, AC input current, temperature sensor readings, fan speed, video input status, firmware revision, and light level sensor readings. Also, adjustments or state switching may be performed with respect to settings including, but not limited to: on/off, brightness level, enabling/disabling ambient light sensor, various alert settings, IP address, customer defined text/video, display matrix settings, display of image settings via OSD, and various software functions. These settings/states may be monitored and altered from either of the two data interface connections 32 and 33.

As shown herein, various electronic assemblies of an exemplary electronic display may be easily removed, serviced, and/or replaced without removal of the display from its mounted position. This is beneficial at least with respect to the downtime of the display for servicing, the cost of servicing, the risk of damaging the display by removing the display from its mounted position and transporting it to an environment suitable for servicing, and the risk of investing in an expensive display which may need to be entirely removed and replaced due to the failure of one small internal component. Further, electronic assembly removal, servicing, and/or replacement without display demounting permits manufacturers to offer a variety of different display types, while only having to manufacture a single base model. Manufacturers may offer a number of different display controller assemblies that can meet a variety of user needs. Users can also upgrade display controller assemblies as their needs change or as the technology advances. Users may easily remove the old electronic assemblies and install the new electronic assemblies without requiring special equipment or extensive training. Each removable assembly may be held in place with common mechanical fastening means (such as a screw) so that removal/installation can be done with commonly available tools and a minimal amount of guidance from the manufacturer. Alternatively, closing tabs may be used in other embodiments, which closing tabs may be designed to permit tool-less tab release and subsequent electronic assembly removal.

Having shown and described various exemplary electronic display embodiments, those skilled in the art will realize that many variations and modifications may be made to affect the described embodiments and still be within the scope of the general inventive concept. Thus, many of the elements indicated above may be altered or replaced by different elements that will provide the same result and fall within the spirit of the claimed embodiments.

What is claimed is:

1. A modular electronic display comprising:
an electronic display assembly located within a housing, a back of the housing configured for mounting of the electronic display on a vertical surface;
a backplane located within the housing and in electrical communication with the electronic display assembly;
at least one removable electronic component electrically connected to the backplane through releasable engagement of a shared electrical connector, the at least one removable electronic component including a timing and control unit; and
at least one access opening through a wall of the housing, the at least one access opening permitting the at least one electronic component to be exchanged while the electronic display is mounted to a vertical surface;
whereby the electronic display is electronically reconfigurable and upgradeable without demounting the electronic display from the vertical surface.

2. The electronic display of claim 1, wherein:
the electronic display assembly is selected from the group consisting of an OLED display, a plasma display, a LCD display, and a backlit LCD display.

3. The electronic display of claim 1, wherein the electronic display assembly comprises a display panel, a LCD assembly located rearward of the display panel, and a backlight located rearward of the LCD assembly but forward of the backplane.

4. The electronic display of claim 1, wherein the plurality of removable electronic components further includes:
N+1 power supplies;
where N is the number of power supplies that are necessary to power the electronic display assembly.

5. The electronic display of claim 4, wherein the N+1 power supplies are hot-swappable.

6. The electronic display of claim 1, wherein an analog-to-digital converter is integrated with the timing and control unit.

7. The electronic display of claim 1, wherein the backplane includes at least one data interface connection.

8. The electronic display of claim 1, wherein the shared electrical connector is a self-aligning electrical connector.

9. The electronic display of claim 8, wherein the self-aligning electrical connector is a blind mate connector.

10. The electronic display of claim 1, further comprising an access panel removably installed in at least one of the plurality of access openings.

11. A multi-configuration, upgradeable, electronic display based on a common display platform, comprising:
a common electronic display assembly located within a common housing, a back of the housing configured for mounting of the electronic display on a vertical surface;
a common backplane located within the common housing and in electrical communication with the common electronic display assembly;
a plurality of electronic components electrically connected to the backplane through releasable engagement of shared electrical connectors, the plurality of electronic components including a timing and control unit and one or more other electronic components selected from the group consisting of a power supply and an analog-to-digital (A/D) converter; and
one or more access openings through one or more walls of the common housing, the one or more access openings located and dimensioned so as to permit passage of the electronic components therethrough;
wherein, the plurality of electronic components are selectively exchangeable with other electronic components via the one or more access openings in the housing; and
whereby, the electronic display is reconfigurable and upgradeable by exchanging one or more of the plurality of electronic components without demounting the electronic display from the vertical surface.

12. The electronic display of claim 11, wherein:
the electronic display assembly is selected from the group consisting of an OLED display, a plasma display, a LCD display, and a backlit LCD display.

13. The electronic display of claim 11, wherein the electronic display assembly comprises a display panel along an opening in the front of the housing, a LCD assembly located rearward of the display panel, and a backlight located rearward of the LCD assembly but forward of the backplane.

14. The electronic display of claim 11, wherein the plurality of electronic components includes:
N+1 hot-swappable power supplies;
where N is the number of power supplies that are necessary to power the electronic image-producing assembly.

15. The electronic display of claim 11, wherein the timing and control unit includes an integrated analog-to-digital converter.

16. The electronic display of claim 11, wherein the shared electrical connectors are self-aligning electrical connectors.

17. The electronic display of claim 16, wherein the self-aligning electrical connectors are blind mate connectors.

* * * * *